United States Patent [19]
Yamazaki et al.

[11] Patent Number: 5,438,330
[45] Date of Patent: Aug. 1, 1995

[54] ABSOLUTE ENCODER

[75] Inventors: Yuji Yamazaki, Yokohama; Koh Ohno, Zama, both of Japan

[73] Assignee: Nikon Corporation, Tokyo, Japan

[21] Appl. No.: 347,227

[22] Filed: Nov. 23, 1994

Related U.S. Application Data

[63] Continuation of Ser. No. 965,430, Oct. 23, 1992, abandoned.

[30] Foreign Application Priority Data

Oct. 28, 1991 [JP] Japan .................. 3-280142
Oct. 28, 1991 [JP] Japan .................. 3-280143

[51] Int. Cl.⁶ ............................................ H03M 1/30
[52] U.S. Cl. ................................... 341/11; 341/13
[58] Field of Search ........................... 341/1-4, 341/6-9, 11-14; 250/231.18

[56] References Cited

U.S. PATENT DOCUMENTS

4,914,437  4/1990  Kibrick et al. .................. 341/3

Primary Examiner—Marc S. Hoff
Attorney, Agent, or Firm—Shapiro and Shapiro

[57] ABSTRACT

An absolute encoder has a code plate formed with an absolute pattern and an incremental pattern. A first detector detects the absolute pattern, and outputs an absolute signal. A second detector detects the incremental pattern, and outputs an incremental signal. The absolute encoder stores the absolute signal according to an external input signal, and forms a corrected absolute signal on the basis of the incremental signal input after the absolute signal is stored.

13 Claims, 11 Drawing Sheets

| MSB | X3 | X2 | X1 | X0 | LSB |
|---|---|---|---|---|---|
| 1 | 0 | 0 | 0 | 0 | 1 |
| 0 | 0 | 0 | 0 | 1 | 1 |
| 1 | 0 | 0 | 1 | 0 | 0 |
| 0 | 0 | 0 | 1 | 1 | 1 |
| 0 | 0 | 1 | 0 | 0 | 0 |
| 1 | 0 | 1 | 0 | 1 | 1 |
| 1 | 0 | 1 | 1 | 0 | 0 |
| 0 | 0 | 1 | 1 | 1 | 1 |
| 0 | 1 | 0 | 0 | 0 | 1 |
| 1 | 1 | 0 | 0 | 1 | 0 |
| 1 | 1 | 0 | 1 | 0 | 1 |
| 0 | 1 | 0 | 1 | 1 | 0 |
| 0 | 1 | 1 | 0 | 0 | 1 |
| 1 | 1 | 1 | 0 | 1 | 0 |
| 1 | 1 | 1 | 1 | 0 | 1 |
| 0 | 1 | 1 | 1 | 1 | 0 |

ABSOLUTE ENCODER

This is a continuation of application Ser. No. 07/965,430, filed Oct. 23, 1992, now abandoned.

BACKGROUND OF THE INVENTION

1. Field of the Invention

The present invention relates to an absolute encoder.

2. Related Background Art

A conventional absolute encoder comprises an absolute pattern, multi-bit detection elements for detecting the absolute pattern, a multiplexer for sequentially switching and outputting the outputs from the detection elements, and a converter for receiving the output from the multiplexer, and demultiplexing the output to convert it into absolute data. As the absolute pattern, an M-sequence pattern, a gray code pattern, a binary code pattern, and the like are known.

However, in the absolute encoder of this type, since the pattern is detected by sequentially switching the outputs from the detection elements, it takes much time to detect one data. When the moving speed of the encoder is increased, the encoder moves to another data before one data is input, and wrong data may be output. As a result, the speed upon detection of the pattern is limited.

SUMMARY OF THE INVENTION

It is an object of the present invention to provide an absolute encoder which is not influenced by the switching time of detectors.

In order to achieve the above object, there is provided an absolute encoder comprising a code plate formed with an absolute pattern and an incremental pattern, first detection means for detecting the absolute pattern, and outputting an absolute signal, second detection means for detecting the incremental pattern, and outputting an incremental signal, and means for storing the absolute signal according to an external input signal, and forming a corrected absolute signal on the basis of the incremental signal input after the absolute signal is stored.

The first detection means of the absolute encoder has a plurality of detection elements for detecting the absolute pattern, conversion means for converting parallel signals from the plurality of detection elements into a serial signal, and processing means for processing the serial signal.

The absolute encoder also comprises means for, when the absolute position is moved during an input operation of initial data to pattern generation means, re-inputting initial data.

Furthermore, a predetermined pattern of the output from the pattern generation means is detected, and the detected pattern is output as an original position signal.

In the absolute encoder of the present invention, when a power supply is turned on or when a demand signal is input, absolute data of a first detector, which data is caused to coincide with the change point of an incremental pulse signal obtained from a second detector, is input to the pattern generation means as initial data. Thereafter, the pattern generation means is operated in synchronism with the output signal from the second detector, thereby obtaining an electrical signal pattern equivalent to the pattern of an absolute first track, and synchronous with the output from the second detector. Thus, only when the initial data is input, the encoder is influenced by the switching time of the first detector. However, thereafter, since the pattern is electrically generated based on the signal from the second detector, absolute data free from the influence of the switching time can be obtained.

In some encoders, the absolute position may be moved during an input operation of initial data. Therefore, wrong initial data is input, and the output from the pattern generation means operated according to the output from the second detector is not equivalent to the pattern of the absolute first track.

Thus, means for, when the absolute position is moved during an input operation of initial data, re-inputting initial data is added, thus solving the above-mentioned problem.

When a predetermined pattern of the pattern generation means is detected and output, an original position signal can be generated without arranging an original position signal track and an original position signal detector. When the original position signal is generated, the absolute encoder can be operated with reference to the original position.

According to the present invention, as described above, a scanning operation need only be initially performed once, and thereafter, the absolute position of the encoder can be electrically detected in synchronism with the movement of the encoder. Even when the encoder is moved during scanning, initial data is re-input, thus preventing wrong data from being input. In addition, an original position signal can be generated without arranging a specific original position signal detector.

The above-mentioned absolute encoder will be described as the first embodiment.

However, only when the power supply is turned on or when the demand signal is input, the above-mentioned absolute encoder can detect whether or not the output from the pattern generation means is normal.

It is, therefore, the second object of the present invention to provide an absolute encoder which can always detect whether or not the output from pattern generation means is normal instead of only when the power supply is turned on or when the demand signal is input.

In order to achieve the above object, there is provided an absolute encoder comprising a code plate formed with an absolute track formed by one track of an absolute pattern, and an incremental track formed by an incremental pattern formed at a pitch equal to or smaller than a minimum unit of the absolute pattern, absolute detection means, constituted by arranging a plurality of elements along the absolute track, for detecting a code of the absolute track, incremental detection means, constituted by arranging a plurality of elements along the incremental track, for detecting a code of the incremental track, absolute position detection means for outputting an incremental signal corresponding to the code of the absolute track read by the absolute track detection means only when a power supply is turned on or when an absolute position demand signal is input, and thereafter, outputting an incremental signal read by the incremental detection means so as to always output an incremental signal indicating an absolute position, and an abnormality detection unit having a pattern generation circuit for generating a code corresponding to the code detected by the absolute detection means on the basis of the incremental signal from the incremental detection means, and comparison means for comparing the code detected by the absolute detection means and the code output from the pattern generation means.

According to the effect of this absolute encoder, the pattern generation means generates a code corresponding to the code of the absolute track on the basis of the incremental signal from the incremental detection means (or the absolute position detection means). The abnormality detection unit causes the comparison means to compare the code from the pattern generation means with the code of the absolute track detected by the absolute detection means so as to detect whether or not the incremental signal from the incremental detection means (or the absolute position detection means) obtained after the absolute position (or 0) read by the absolute detection means is set when the power supply is turned on or when the demand signal is input. The abnormality detection unit then outputs a signal indicating a normal or abnormal state from an output terminal different from a terminal for outputting the incremental signal indicating the absolute value.

As described above, the absolute encoder of the present invention reads the code from the absolute detection means only when the power supply is turned on or when the demand signal is input, detects the absolute position using the read code as an initial value, and externally outputs the detected absolute position. However, the absolute detection means always reads a signal from the absolute track, and the signal read by the absolute detection means is compared with the code output from the pattern generation means, thereby detecting whether or not the signal indicating the absolute position is normal.

The absolute encoder described above can detect whether or not the incremental signal indicating the absolute position output during rotation is normal not only when the power supply is turned on or when the demand signal is input but also every time the code of the absolute track read by the absolute detection means changes.

The absolute encoder for achieving the second object will be described as the second and third embodiments.

DESCRIPTION OF THE PREFERRED EMBODIMENTS

Figure 1:
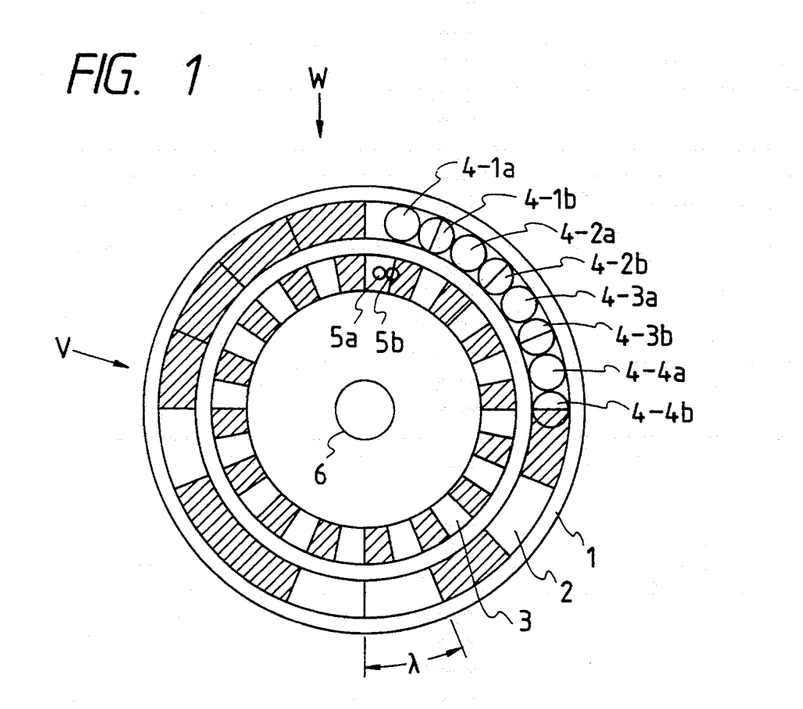
FIG. 1 is a plan view showing patterns of a code plate and detectors used in the first embodiment of the present invention.

FIG. 1 is a schematic plan view showing detectors of an encoder according to the present invention. A code plate 1 is provided with a track 2 formed with a 1-track absolute pattern defined by an M sequence of a code "0" and a code "1". A white section (minimum read unit) is actually a transparent portion, and indicates a code "1". A hatched section (minimum read unit) is actually a black light-shielding portion, and indicates a code "0".

According to this embodiment, when the code plate is rotated clockwise in FIG. 1, the pattern can express the following sequence from a position of an arrow V:

000111101011001

When the code plate is rotated counterclockwise, the pattern can express the following sequence from a position of an arrow W:

000100110101111

This sequence is an M-sequence pattern obtained by adding one "0" before the pattern.

A total of eight photodiodes 4-1$a$ to 4-4$b$ partially constitute a first detector, and are arranged along the absolute first track 2 at $\lambda/2$-intervals ($\lambda$ is the width of the minimum read unit).

An incremental second track 3 is formed inside the absolute first track 2. The incremental second track 3 is formed by a bright/dark pattern at an equal interval, and the width of each of the bright and dark portions is $\lambda/2$ of the width $\lambda$ of the minimum read unit of the absolute first track 2. Detection elements 5$a$ and 5$b$ constitute a second detector. When each detection element detects a bright portion of the incremental second track 3, it outputs "H"; when it detects a dark portion, it outputs "L". The detection elements 5$a$ and 5$b$ are arranged at an interval ½ the width of the bright or dark portion of the incremental second track 3.

Figure 2:
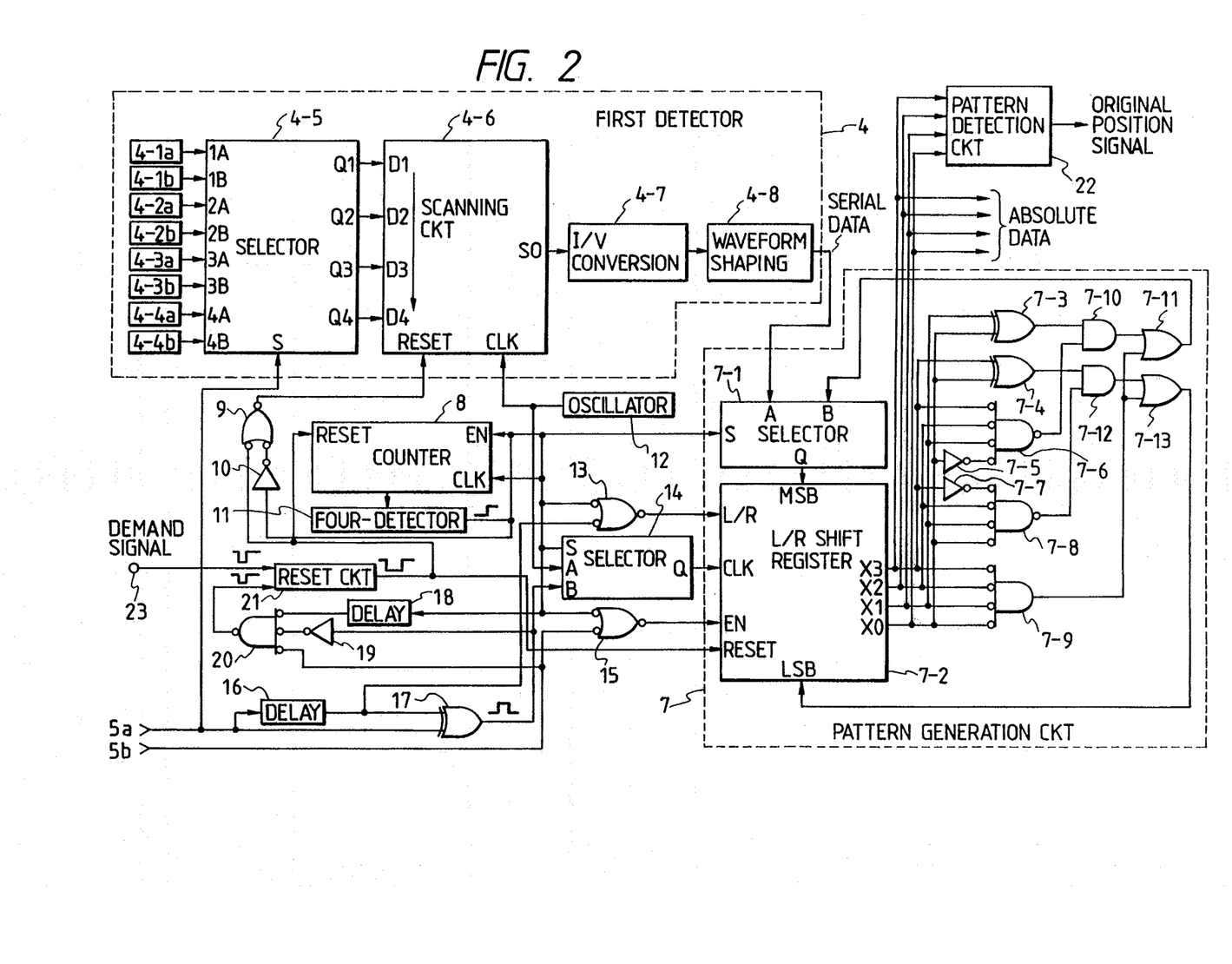
FIG. 2 is a block diagram showing the first embodiment of the present invention.
Figure 3:
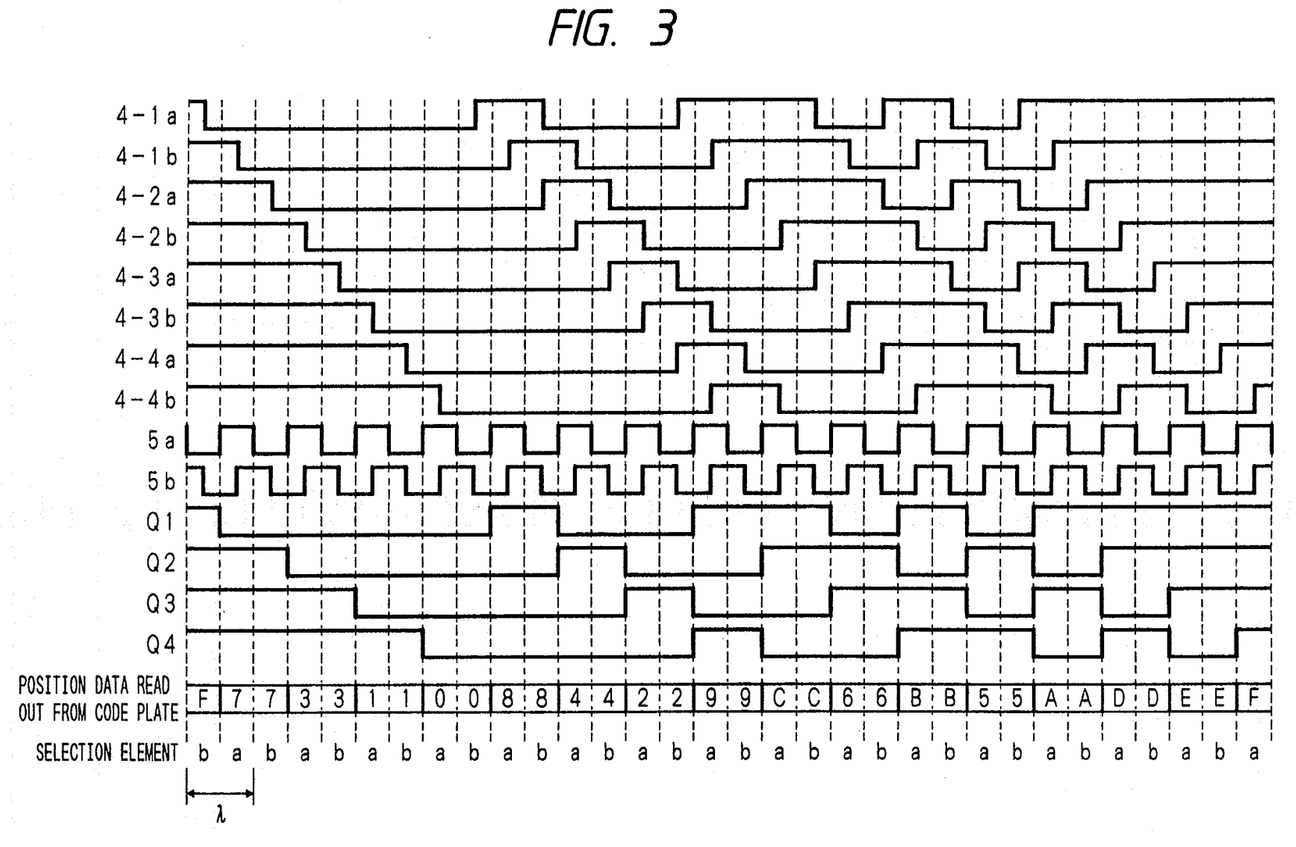
FIG. 3 is a timing chart showing the phase relationship among the outputs from the detectors.

Therefore, when the code plate 1 is rotated clockwise from the state shown in FIG. 1, the outputs from the photodiodes 4-1$a$ to 4-4$b$ and the detection elements 5$a$ and 5$b$ change, as shown in FIG. 3. In FIG. 3, the output signals from the photodiodes 4-1$a$ to 4-4$b$ are indicated by 4-1$a$ to 4-4$b$, the output signals from the detection elements 5$a$ and 5$b$ are indicated by 5$a$ and 5$b$, the output signals from a selector 4-5 (FIG. 2) are indicated by $Q_1$ to $Q_4$, and $\lambda$ corresponds to the width $\lambda$ of the minimum read unit of the absolute first track 2. FIG. 2 is a block diagram of a circuit of this embodiment. A first detector 4 is constituted by the photodiodes 4-1$a$ to 4-4$b$, the selector 4-5, a scanning circuit 4-6, an I/V conversion circuit 4-7, and a waveform shaping circuit 4-8.

The outputs from the photodiodes 4-1$a$ to 4-4$b$ are input to the selector 4-5. When the S input of the selector 4-5 is at "H" level, the selector 4-5 selects four A input terminals 1A, 2A, 3A, and 4A of eight input terminals 1A to 4B, and outputs the selected signals to output terminals $Q_1$, $Q_2$, $Q_3$, and $Q_4$. When the S input is at "L"

level, the selector 4-5 selects the four B input terminals 1B, 2B, 3B, and 4B, and outputs the selected signals to the output terminals $Q_1$, $Q_2$, $Q_3$, and $Q_4$. The outputs from the selector 4-5 are input to the scanning circuit 4-6. The scanning circuit 4-6 sequentially switches the input signals at four input terminals $D_1$ to $D_4$ in synchronism with the input signal at a terminal CLK, and outputs the selected signal to an output terminal SO. When an "L"-level signal is input to an input terminal RESET, the scanning circuit 4-6 unconditionally selects the input terminal $D_1$, and does not perform a switching operation. When the RESET input goes to "H" level, the scanning circuit 4-6 starts a scanning operation. Therefore, when the RESET input changes like H→L→H, the input terminals $D_2$, $D_3$, and $D_4$ can be sequentially scanned to have the input terminal $D_1$ as the start point.

The signals output from the photodiodes 4-1a to 4-4b, the selector 4-5, and the scanning circuit 4-6 are current signals. The I/V conversion circuit 4-7 converts the output from the scanning circuit 4-6 into a voltage signal, and the waveform shaping circuit 4-8 shapes the voltage signal into a rectangular waveform. Note that the selector 4-5 and the scanning circuit 4-6 can be constituted by, e.g., analog switches.

The S input of the selector 4-5 is connected to the detection element 5a, and is switched according to the logic level of the detection element 5a. For this reason, the outputs shown in FIG. 3 appear at the output terminals $Q_1$ to $Q_4$. Note that selection elements a and b in FIG. 3 represent a and b groups of the photodiodes 4-1a to 4-4b. When the output from the detection element 5a is at "L" level, the selector 4-5 selects the B group of input terminals, i.e., the b group of photodiodes 4-2b, 4-2b, 4-3b, and 4-4b; when the output from the detection element 5a is at "H" level, the selector 4-5 selects the A group of input terminals, i.e., the a group of photodiodes 4-1a, 4-2a, 4-3a, and 4-4a. When a demand signal is input to a terminal 23, the output from a reset circuit 21 changes from H level to L level, and this output serves as a reset pulse. Thus, a counter 8 is reset, and the output from the counter 8 becomes "0". Therefore, the output from a four-detector 11 is at "L" level, the EN input of the counter 8 goes to "L" level, and the counter 8 is set in a count enable state. The "L"-level output from the four-detector 11 causes the S inputs of selectors 7-1 and 14 and one input terminal of each of AND gates 13 and 15 to go to "L" level.

When the S input is at "L" level, each of the selectors 7-1 and 14 selects an input terminal A, and outputs the selected signal to an output terminal Q; when the S input is at "H" level, the selector selects an input terminal B, and outputs the selected signal to the output terminal Q.

Therefore, since the selector 7-1 selects the input terminal A, the MSB input of an LR shift register 7-2 receives the output from the first detector (the output from the waveform shaping circuit 4-8).

Since one input of the AND gate 13 goes to "L" level, and its output also goes to "L" level, the L/R input of the LR shift register 7-2 goes to "L" level.

In addition, since the S input of the selector 14 also goes to "L" level, the input terminal A is selected.

Furthermore, since one input of the AND gate 15 goes to "L" level, and its output also goes to "L" level, the EN input of the LR shift register 7-2 goes to "L" level.

A pattern generation circuit 7 is constituted by the selector 7-1, the LR shift register 7-2, and gates 7-3 to 7-13. The LR shift register 7-2 selects data input at its MSB input when the L/R input is at "L" level, and sequentially shifts its outputs $X_3$, $X_2$, $X_1$, and $X_0$ from the MSB side ($X_3$) to the LSB side ($X_0$) when a clock is input to the CLK input. The LR shift register 7-2 selects data input at its LSB input when the L/R input is at "L" level, and sequentially shifts its outputs from the LSB side ($X_0$) to the MSB side ($X_3$) when a clock is input to the CLK input. When the EN input of the register 7-2 is at "L" level, only a clock is effective. When an L-level signal is input to the RESET input, the outputs from the register 7-2 become "0", and a shift operation is inhibited until the RESET input goes to "H" level again. After a demand signal is input to the terminal 23, when the output from the reset circuit 21 changes from "L" level to "H" level after an elapse of a predetermined period of time, the LR shift register 7-2 and the counter 8 begin their operations.

Since the output from the AND gate 13 is initially at "L" level, data at the MSB side is selected. The MSB input receives the output from the first detector 4 through the selector 7-1. An oscillator 12 outputs a clock. This clock is input to the CLK input of the counter 8 and to the CLK input of the LR shift register 7-2 through the selector 14, and is also input to the CLK input of the scanning circuit 4-6. Every time a clock is input to the CLK input, the content of the counter 8 is incremented by 1, the scanning circuit 4-6 sequentially switches and outputs the input like $D_1$→$D_2$→$D_3$→$D_4$, and the LR shift register sequentially shifts its outputs from the MSB side ($X_3$) to the LSB side ($X_0$) by 1.

Therefore, data at the input terminal $D_1$ is set at the output terminal $X_3$ of the LR shift register 7-2 in response to the first clock, and data at the input terminal $D_2$ is set at the output terminal $X_3$ in response to the second clock. Therefore, when four clocks are input, data at the input terminal $D_1$ is sequentially shifted in the order of $X_3$, $X_2$, and $X_1$, and appears at the output terminal $X_0$. Data at the input terminal $D_2$ appears at the output terminal $X_3$ in response to the second clock, is sequentially shifted in the order of $X_2$ and $X_1$, and appears at the output terminal $X_1$. Data at the input terminal $D_3$ is input to the output terminal $X_3$ in response to the third clock, is shifted by one in response to the fourth clock, and appears at the output terminal $X_2$. Data at the input terminal $D_4$ is set at the output terminal $X_3$ in response to the fourth clock.

When the four clocks are input, the output from the counter 8 becomes "4", and the output from the four-detector 11 goes to "H" level since the four-detector 11 detects "4". Then, the EN input of the counter 8 goes to "H" level, and the count operation is stopped. The S input of the selector 7-1 goes to "H" level, and the selector selects the input terminal B. Thus, one input of the AND gate 13 goes to "H" level, the S input of the selector 14 goes to "H" level, and one input of the AND gate 15 goes to "H" level. Therefore, the MSB input of the LR shift register 7-2 receives the input of the OR gate 7-11 of the pattern generation circuit 7, its L/R input is determined by the output from a delay element 16, its CLK input receives the output from an EX-OR gate 17, and its EN input receives the logic state of the detection element 5b.

The delay element 16 and the EX-OR gate 17 constitute an edge detection circuit, and the EX-OR gate 17 outputs a pulse in response to every change point of the output from the detection element 5a.

The EN input of the LR shift register 7-2 goes to "H" level when the output from the detection element 5b is at "H" level, and goes to "L" level when the output is at "L" level. For this reason, only a pulse generated upon a change in output from the detection element 5a when the output from the detection element 5b is at "L" level is accepted as an effective clock. The LSB input of the LR shift register 7-2 receives the output from the OR gate 7-13, and its MSB input receives the output from the OR gate 7-11.

Figure 4:
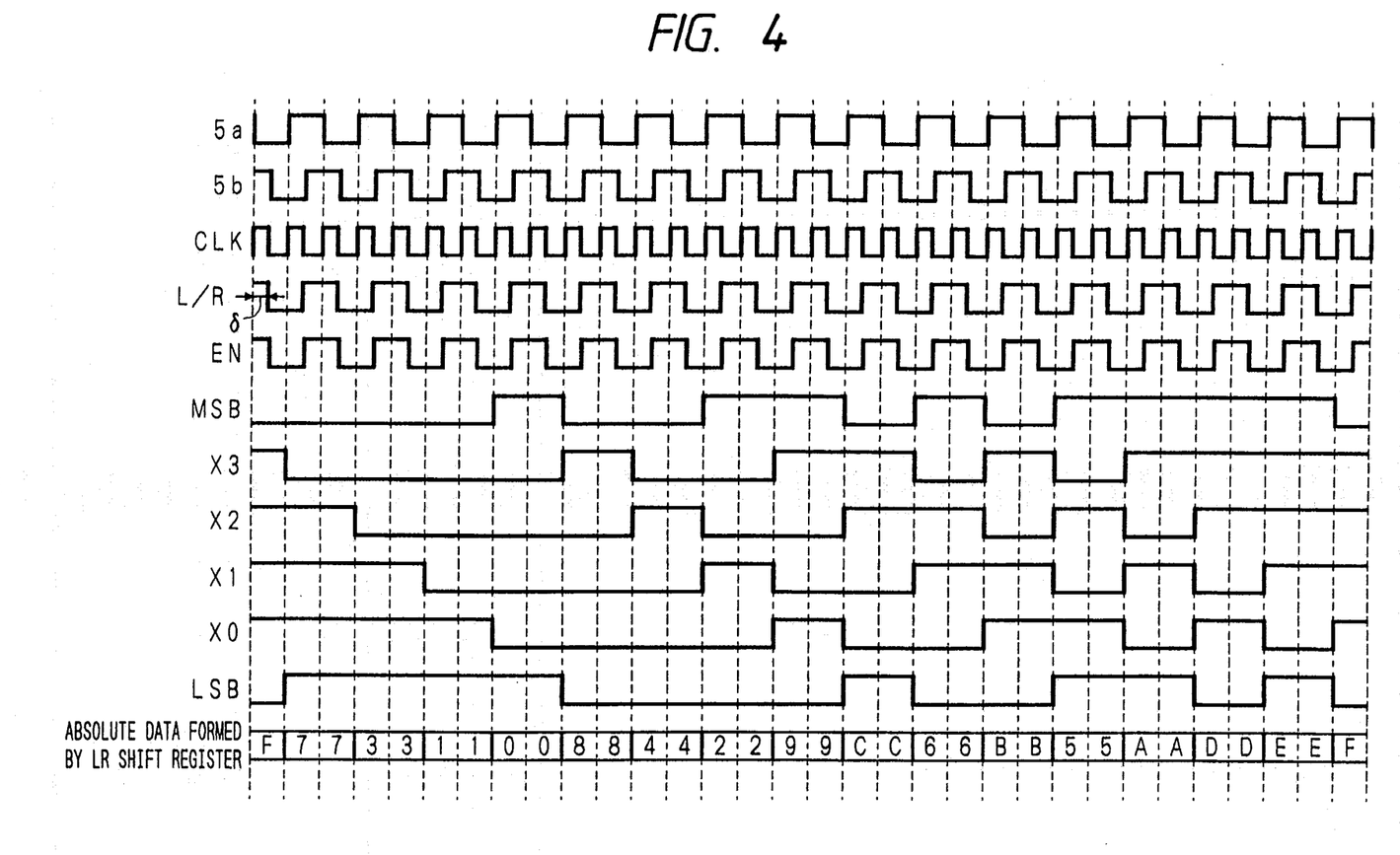
FIG. 4 is a timing chart showing the input/output relationship of an LR shift register obtained when the code plate is moved in the positive direction.
Figure 5:
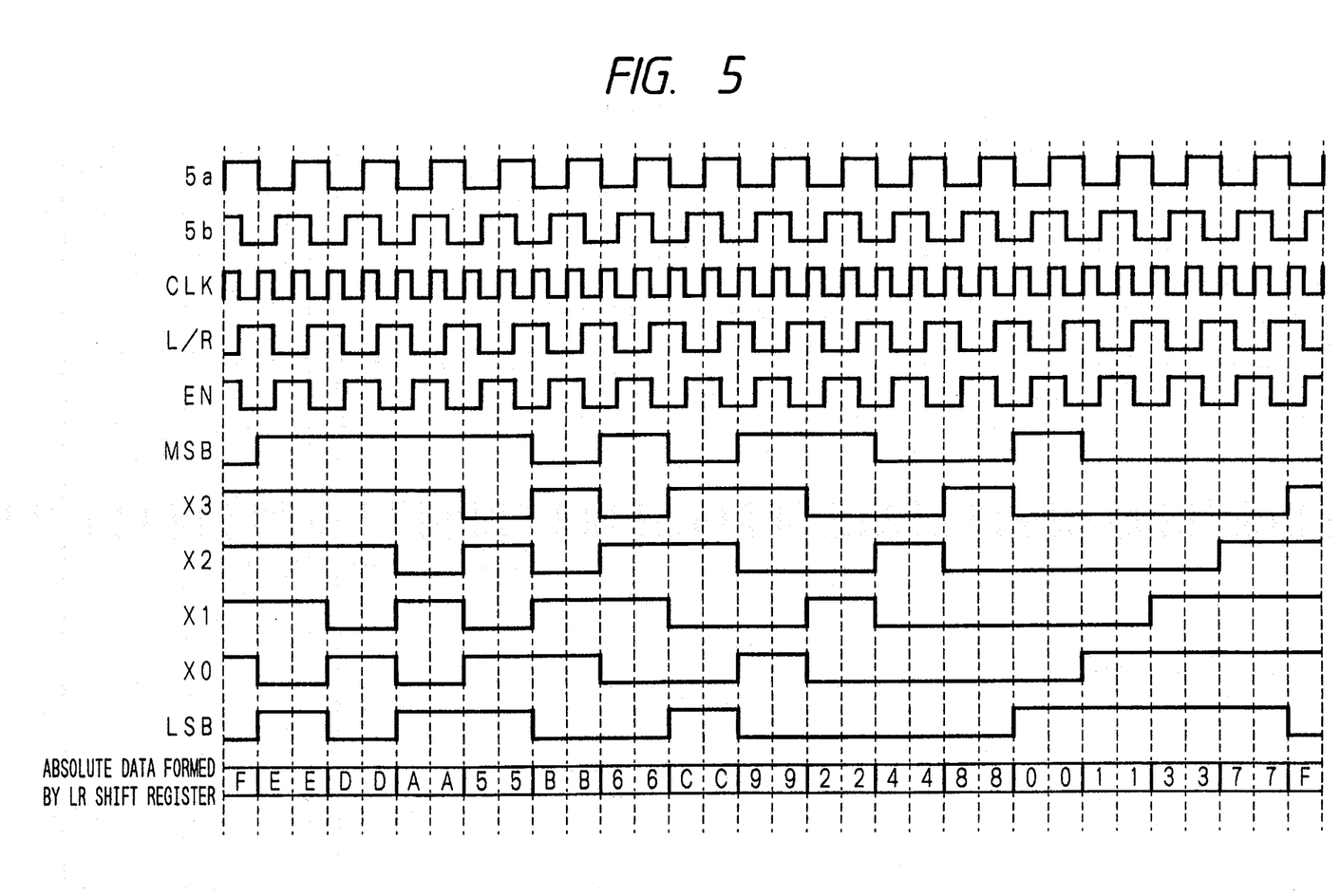
FIG. 5 is a timing chart showing the input/output relationship of the LR shift register obtained when the code plate is moved in the negative direction.
Figure 8:
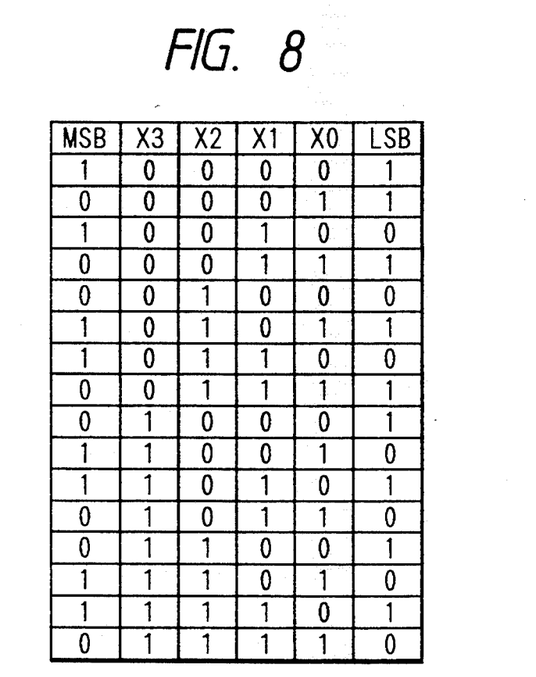
FIG. 8 is a truth table showing the output from the LR shift register and the MSB and LSB inputs.

Both the LSB and MSB inputs are determined by the outputs $X_0$, $X_1$, $X_2$, and $X_3$ from the LR shift register 7-2, and the relationship between the LSB and MSB inputs and the outputs $X_0$, $X_1$, $X_2$, and $X_3$ is as shown in FIG. 8. The outputs $X_3$, $X_2$, $X_1$, and $X_0$ from the LR shift register 7-2 are input to a pattern detection circuit 22. The pattern detection circuit 22 detects a predetermined pattern from the input patterns, and outputs an original position signal. The outputs $X_3$, $X_2$, $X_1$, and $X_0$ are determined as absolute data, are converted into, e.g., binary data, and are used as position data. With the above-mentioned operation, an operation after initial data is set (stored) is as follows. When the output from the detection element 5a changes in a state wherein the code plate 1 moves and the output from the detection element 5b is at "L" level, the LR shift register 7-2 operates, and the absolute data change. FIGS. 4 and 5 show change patterns at that time. FIG. 4 shows a change pattern when the code plate 1 is moved in the positive direction (i.e., rotated clockwise in FIG. 1), and FIG. 5 shows a change pattern when the code plate 1 is moved in the direction opposite to FIG. 4. In FIG. 4, the outputs from the detection elements 5a and 5b change, as indicated by reference numerals 5a and 5b, and the EN input of the LR shift register 7-2 receives the output from the detection element 5b. The L/R input of the LR shift register 7-2 receives a signal obtained by delaying the output from the detection element 5a by δ by the delay element 16. The output from the EX-OR gate 17, i.e., the EX-ORed result of the output from the detection element 5a and the output from the delay element 16 is input to the CLK input of the LR shift register 7-2 through the selector 14.

Figure 6:
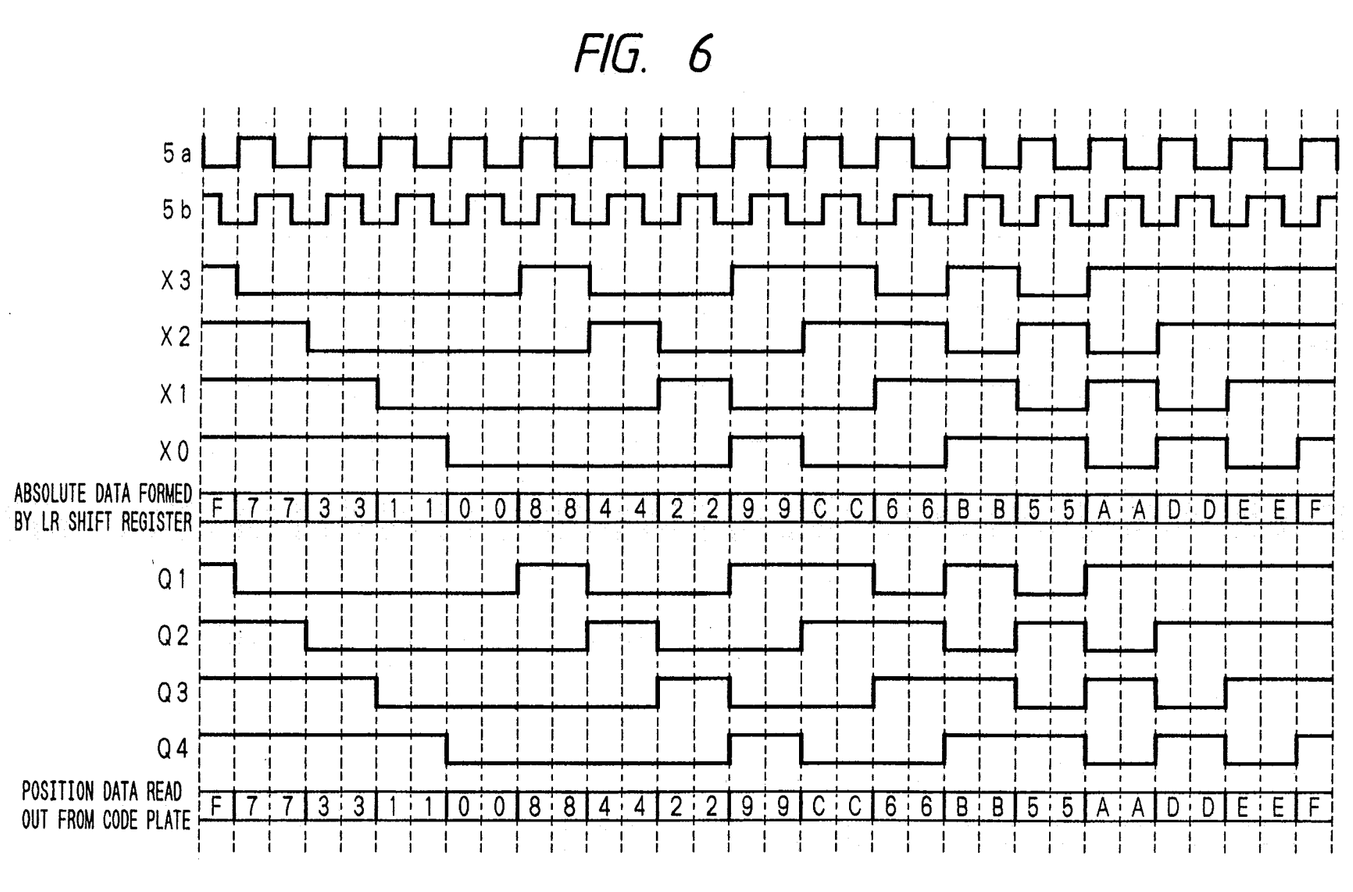
FIG. 6 is a timing chart showing the relationship between the output from a selector and the output from the LR shift register obtained when the code plate is moved in the positive direction.
Figure 7:
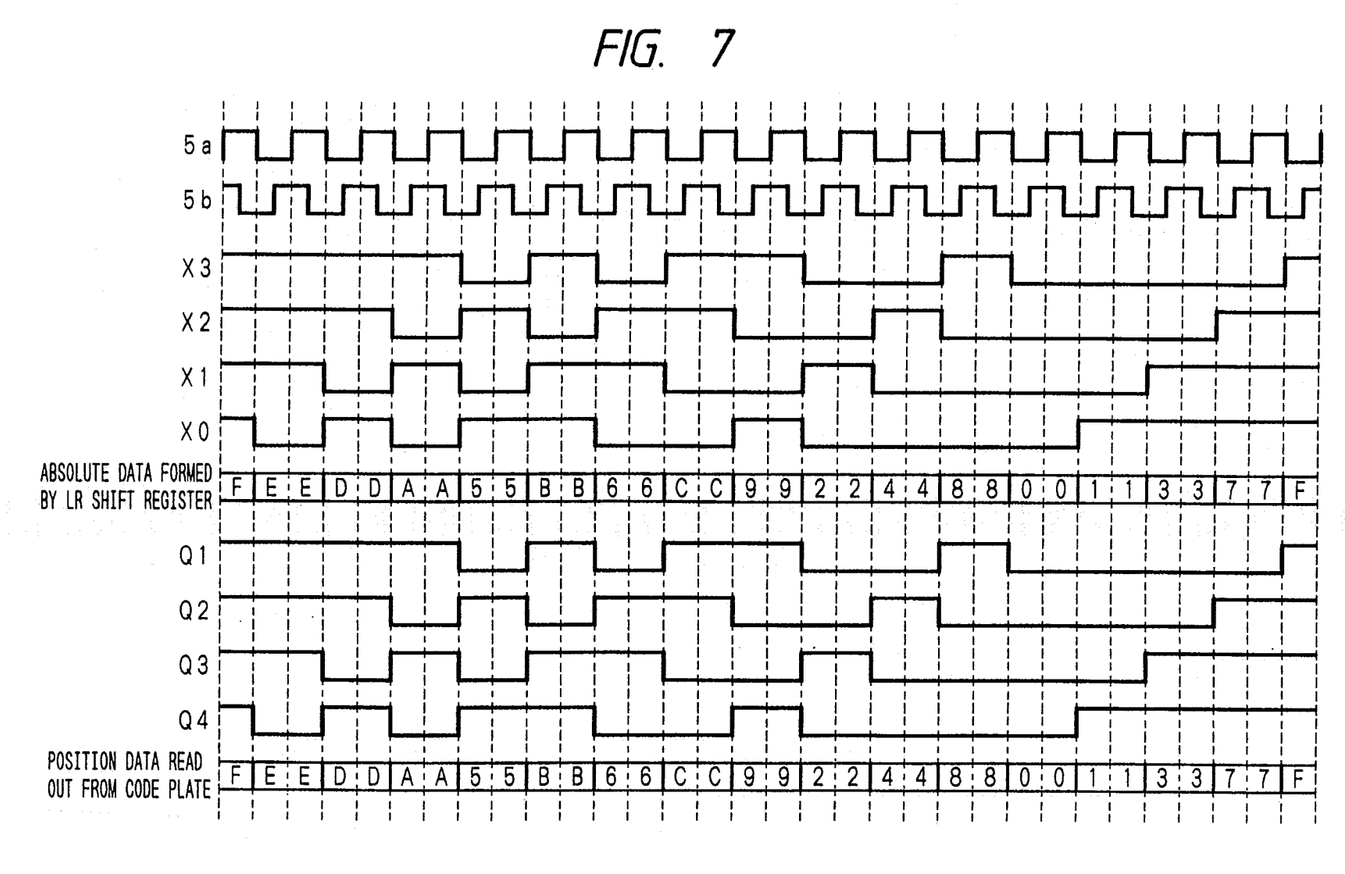
FIG. 7 is a timing chart showing the relationship between the output from the selector and the output from the LR shift register obtained when the code plate is moved in the negative direction.

The outputs $X_3$, $X_2$, $X_1$, and $X_0$ of the LR shift register 7-2 change in response to the leading edge of the CLK input, i.e., the change point of the output from the detection element 5a when the EN input is at "L" level, i.e., when the output from the detection element 5b is at "L" level. More specifically, the outputs change in synchronism with the period of the detection element 5a. The shift direction (L/R) of the shift register is determined by the L/R input. Therefore, when the output from the detection element 5a changes from "L" level to "H" level, the shift register shifts its outputs from $X_3$ toward $X_0$; when the output changes from "H" level to "L" level, the shift register shifts its output from $X_0$ toward $X_3$. FIGS. 6 and 7 are timings charts for the purpose of comparison between the outputs $Q_1$, $Q_2$, $Q_3$, and $Q_4$ from the selector 4-5, and the outputs $X_3$, $X_2$, $X_1$, and $X_0$ from the LR shift register 7-2 at that time. FIG. 6 shows a case wherein the code plate 1 is moved in the positive direction, and FIG. 7 shows a case wherein the code plate 1 is moved in the direction opposite to FIG. 6.

As can be understood from FIGS. 6 and 7, data read from the code plate and absolute data (corrected absolute data) formed by the LR shift register coincide with each other.

Such a coincidence is obtained when initial data is precisely input. Since the initial data is serial data, when the data $Q_1$, $Q_2$, $Q_3$, and $Q_4$ change during scanning, i.e., when the code plate is moved to another absolute position, wrong data is input as initial data, and wrong absolute data is undesirably output. In order to avoid this, a means for, when the absolute position moves before the scanning operation is ended, i.e., before the output from the four-detector 11 goes to "H" level, resetting data, and reading the absolute data again is added. The first input of an OR gate 20 receives the output from the four-detector 11 through a delay element 18, its second input receives the output from the EX-OR gate 17 through an inverter 19, and its third input is connected to the detection element 5b. The output from the OR gate 20 is connected to the reset circuit 21. Therefore, when the output from the detection element 5a changes in a state wherein the output from the four-detector 11 is at "L" level, i.e., during scanning, and the output from the detection element 5b is at "L" level, i.e., when the absolute position moves (FIG. 3), a negative logic pulse is input to the reset circuit 21 to reset the operation, and the operation when the demand signal is input at the terminal 23 is restarted. Thus, initial data is re-input.

Although not shown, since the M sequence is used as the absolute pattern, a detection error of the pattern can be checked and corrected by changing the arrangement of the first detector 4. By adding this means, the reliability of initial data can be improved. In the first embodiment shown in FIG. 1, the tracks 2 and 3 are formed on the code plate 1. However, the tracks 2 and 3 may be formed on another code plate. In addition, the present invention can be applied to a linear encoder in place of the rotary encoder of the above embodiment.

Figure 9:
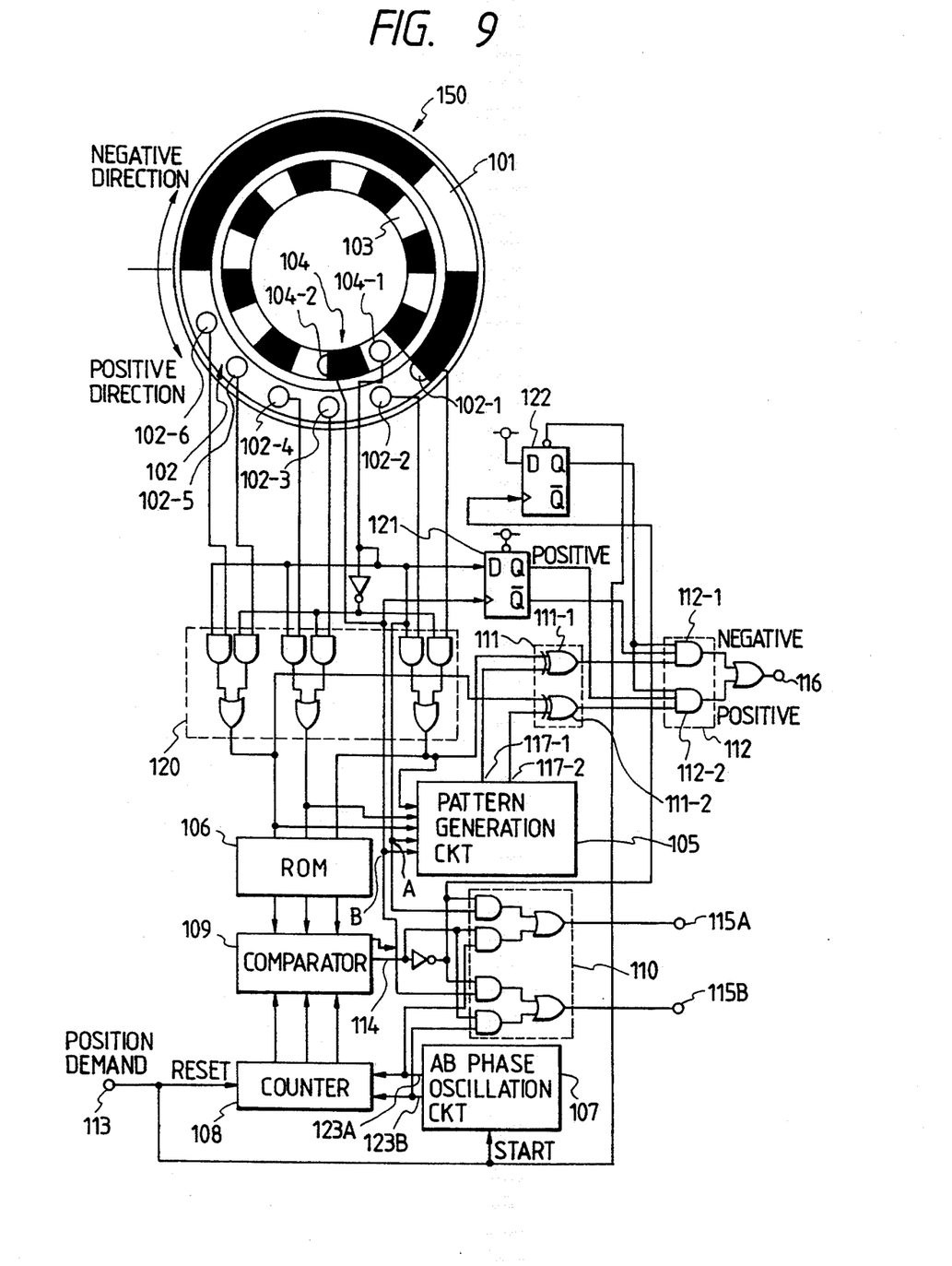
FIG. 9 is a schematic diagram showing an arrangement of the second embodiment.

An absolute encoder of the second embodiment has an arrangement, as shown in FIG. 9.

A code plate 150 is formed with an absolute track 101 formed by an 8-pulse (3-bit) M-sequence pattern, and an incremental track 103, and is rotated by a rotating shaft (not shown). An incremental pattern of the incremental track 103 is formed to have a width ½ the minimum read unit of the absolute track 101.

An absolute detection element group 102 for reading a code of the absolute track 101 includes detection elements 102-1, 102-2, 102-3, 102-4, 102-5, and 102-6, which are arranged along the absolute track 101 at an interval ½ the minimum read unit of the absolute track 101. An incremental detection element group 104 for reading a code of the incremental track 103 includes an A phase incremental detection element 104-1 and a B phase incremental detection element 104-2.

A control circuit can be roughly classified into an absolute position detection unit for outputting an absolute position, and an abnormality detection unit for outputting a signal indicating whether or not the absolute position is normal. The absolute position detection unit is constituted by the detection element groups 102 and 104, selection circuits 110 and 120, a ROM 106, an AB phase oscillation circuit 107, a counter 108, and a comparator 109. The abnormality detection unit is constituted by the detection element group 102, the selection circuit 120, a pattern generation circuit 105, an abnormality detector 111, a gate 112, and flip-flops 121 and 122.

When the code plate 150 and the detection element groups 102 and 104 have the positional relationship shown in FIG. 9 therebetween when a power supply is turned on or when an absolute position demand signal is input, the absolute position detection unit operates as follows. Note that a white portion of a pattern in each of the absolute track 101 and the incremental track 103 indicates "H" level, and a black portion indicates "L" level. When the code plate 150 and the detection element groups 102 and 104 have the positional relationship shown in FIG. 9 therebetween, the output from the A phase incremental detection element 104-1 is at "H" level. At this time, the selection circuit 120 selects the detection elements 102-2, 102-4, and 102-6 of the detection element group 102. Similarly, if the output from the A phase incremental detection element 104-1 is at "L" level, the selection circuit 120 selects the detection elements 102-1, 102-3, and 102-5.

In the positional relationship shown in FIG. 9, the detection elements 102-2, 102-4, and 102-6 output a "111" signal read from the track 101 to an address bus of the ROM 106 and the pattern generation circuit 105 through the selection circuit 120. The ROM 106 converts the "111" signal into position data "3" indicating the absolute position of the code plate 150, and outputs the position data "3" to the comparator 109 through a data bus. The data "3" indicates the third pulse position of eight pulse positions, and is an initial value indicating the absolute position of the absolute encoder when the power supply is turned on or when the absolute position demand signal is input.

The AB phase oscillation circuit 107 is reset in response to a signal from a terminal 113 when the power supply is turned on or when the absolute position demand signal is input, and thereafter, outputs A and B phase incremental signals respectively from terminals 123A and 123B to the selection circuit 110 and the counter 108. The counter 108 is reset when the power supply is turned on or when the absolute position demand signal is input, as in the AB phase oscillation circuit 107, thereafter, counts incremental signals from the AB phase oscillation circuit 107, and outputs the count value to the comparator 109. When the count value from the counter 108 coincides with the data "3" from the data bus of the ROM 106, the comparator 109 outputs a coincidence signal (L-level signal) from a terminal 114.

The selection circuit 110 switches signals to be output from terminals 115A and 115B on the basis of the coincidence signal. The incremental signals output from the terminals 115A and 115B to an external circuit are those from the AB phase oscillation circuit 107 before the coincidence signal is output from the comparator 109. After the coincidence signal is output, the incremental signals output from the terminals 115A and 115B are those from the detection element group 104. This absolute encoder outputs the incremental signal indicating the absolute position in this manner.

The operation of the abnormality detection unit of this absolute encoder will be described below.

Figure 10:
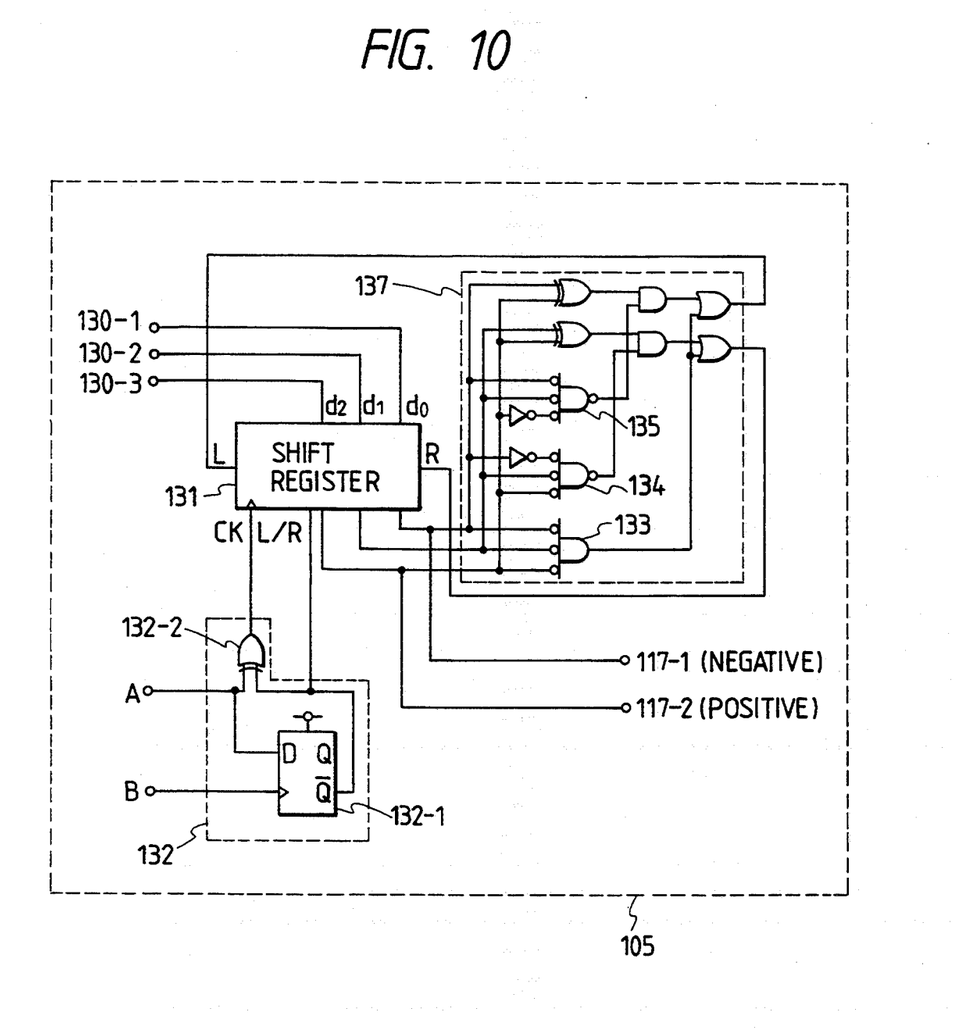
FIG. 10 is a circuit diagram showing an arrangement of a pattern generation circuit shown in FIG. 9.

The pattern generation circuit 105 forms the same signal as a code indicating the absolute position of the absolute track, which changes upon rotation of the code plate 150, on the basis of an initial value indicating the absolute position of the absolute track detected by the absolute detection element group 102, and the code of the incremental track detected by the incremental detection element group 104. The pattern generation circuit 105 is constituted by a shift register 131, a clock generator 132, and a circuit 137, as shown in FIG. 10.

The shift register 131 receives, from terminals 130-1, 130-2, and 130-3, an initial value as absolute position data of the absolute track 101 detected by the detection element group 102 when the power supply is turned on or when the absolute position demand signal is input. The initial value includes values to be set in d0, d1, and d2 of the shift register 131. A value corresponding to a value detected by the absolute detection element 102-1 or 102-2 when the power supply is turned on or when the absolute position demand signal is input is input to d0; a value corresponding to a value detected by the absolute detection element 102-3 or 102-4 is input to d1; and a value corresponding to a value detected by the absolute detection element 102-5 or 102-6 is input to d2. Therefore, in the positional relationship shown in FIG. 9, the values of d0, d1, and d2 are "111". The clock generator 132 is constituted by a flip-flop 132-1 and an EX-OR gate 132-2, detects the rotating direction of the code plate 150 on the basis of the incremental signals from the detection element group 104, and generates a clock in response to the leading edge of the A phase when the code plate is rotated in the positive direction or in response to the trailing edge of the A phase when the code plate is rotated in the negative direction. The clock generator 132 sets the shift direction and timing of the shift register 131 according to the rotating direction and the clock. The shift register 131 shifts the values input to d0, d1, and d2 in the direction set by the clock generator 132. At this time, when the code plate 150 is rotated in, e.g., the positive direction, the shift register 131 shifts the value of d2 to d1 and the value of d1 to d0, and receives a new value in d2. When the code plate is rotated in the negative direction, the shift register shifts the value of d0 to d1 and the value of d1 to d2, and receives a new value in d0. The shift register 131 forms a value indicating the absolute position in this manner.

The circuit 137 is a circuit for forming a new value to be input to d2 or d0 in the shift register 131. Except for a special case to be described below, when the code plate 150 is rotated in the positive direction, the new value to be input to d2 is the value of d2+d0; when it is rotated in the negative direction, the new value to be input to d0 is the value of d2+d0. Since binary notation is adopted, the value of d2 to d0 is "0" or "1". However, when d0, d1, and d2 are all "0"s, i.e., when the input value to a logic element 133 is "000", "1" is always input to d2 when the code plate 150 is rotated in the positive direction; "1" is always input to d0 when the code plate 150 is rotated in the negative direction. When the input value to a logic element 134 is "001", "0" is input to d2 when the code plate 150 is rotated in the positive direction. When the input value to a logic element 135 is "100", "0" is input to d0 when the code plate 150 is rotated in the negative direction. The pattern generation circuit 105 outputs signals from d0 and d2 from terminals 117-1 and 117-2. Therefore, when the initial value is "111", and the code plate 150 is rotated in the positive direction, the pattern generation circuit 105 outputs "1" from the terminal 117-2.

The abnormality detector 111 shown in FIG. 9 is constituted by EX-OR gates (exclusive logic OR gates) 111-1 and 111-2. The EX-OR gate 111-1 is an element for the negative direction, and compares a signal from the detection element 102-1 or 102-2 with a signal from the terminal 117-1 of the pattern generation circuit 105. The EX-OR gate 111-2 is an element for the positive direction, and compares a signal from the absolute detection element 102-5 or 102-6 with a signal from the terminal 117-1 of the pattern generation circuit 105. When the input signals do not coincide with each other, the output signal from the EX-OR gate goes to "H" level. Therefore, when the signal detected by the absolute detection element group is compared with the signal from the pattern generation circuit 105 as a reference signal, whether or not the signal detected by the absolute detection element group is normal can be detected.

The flip-flop 121 detects the rotating direction of the code plate 150 by detecting the phase relationship among the incremental signals of the detection element group 104. The rotating direction of the code plate 150 is the positive direction when the output from a terminal Q of the flip-flop 121 is at "H" level; it is the negative direction when an output from a terminal $\overline{Q}$ is at "H" level. When the code plate 150 is rotated in the positive direction, the flip-flop 121 selects the abnormality detector (111-2) for the positive direction; when the plate is rotated in the negative direction, it selects the abnormality detector (111-1) for the negative direction.

The flip-flop 122 outputs different signals before and after detection of the coincidence signal from the comparator 109. By utilizing this function, whether or not the count value from the counter 108 and the data value of the ROM 106 coincide with each other in the comparator 109 is detected.

When the output from the A phase detection element 104-1 changes from H to L to H upon rotation of the code plate 150 from the positional relationship in FIG. 9 in the positive direction, i.e., at an instance when the output from the A phase detection element 104-1 goes to "H" level, the output from the absolute detection element 102-6 goes to "L" level, and the output from the terminal 117-2 of the pattern generation circuit 105 goes to "L"0 level if normal. Therefore, the two input signals of the EX-OR gate 111-2 go to "L" level, and the output signal from the EX-OR gate 111-2 goes to "L" level. At this time, since the code plate 150 is rotated in the positive direction, the output from the terminal Q of the flip-flop 121 is at "H" level. In this state, if the comparator 109 has already output the coincidence signal, the output from the terminal Q of the flip-flop 122 goes to "H" level. Therefore, at this time, a gate 112-2 is enabled, and the "L"-level output signal from the EX-OR gate 111-2 is output as an output from an abnormality detection terminal 116 to an external circuit. In this manner, a signal indicating whether or not the absolute encoder is normal is output to an external circuit. On the other hand, when the code plate 150 is rotated in the negative direction, the output from the terminal Q of the flip-flop 121 goes to "L" level, and the output from the terminal $\overline{Q}$ goes to "H" level. The gate 112-2 is disabled, a gate 112-1 is enabled, and the output signal from the EX-OR gate 111-1 is output as an output from the abnormality detection terminal 116 to an external circuit. In this manner, an abnormality detection signal indicating whether or not the encoder is normal is output to an external circuit.

In this manner, in the absolute encoder of the second embodiment, an operation for reading the code of the absolute track for the purpose of outputting the absolute position to an external circuit is performed only when the power supply is turned on or when the absolute position demand signal is input is input. However, the absolute detection element group 102 always detects the code of the absolute track. By utilizing this function, the detected code is compared with a code formed by the pattern generation circuit for generating a code corresponding to the code detected by the absolute detection element group 102. In this manner, the absolute encoder of the second embodiment can always discriminate whether or not the detected code is normal.

Therefore, after incremental signals corresponding to the initial value detected by the absolute detection elements are output from the terminals 115A and 115B, when noise is mixed in incremental signals output from the incremental detection element group 104, the pattern generation circuit 105 operates by detecting the positive or negative direction based on the incremental signals mixed with the noise. For this reason, absolute position data generated by the pattern generation circuit suffers from a deviation caused by noise, and of course, the output signal also suffers from a deviation. Since the signal suffering from the deviation is input to the EX-OR gate 111, an abnormal state can be detected. Thereafter, after the power supply is turned on or after the absolute position demand signal is input, whether or not the incremental signals detected by the incremental detection element group 104 are normal can be discriminated.

In this manner, the abnormality detection unit of this absolute encoder always checks whether or not incremental signals after the absolute position (initial value) of the absolute track obtained when the power supply is turned on or when the absolute position demand signal is input is output to an external circuit are normal.

Figure 11:
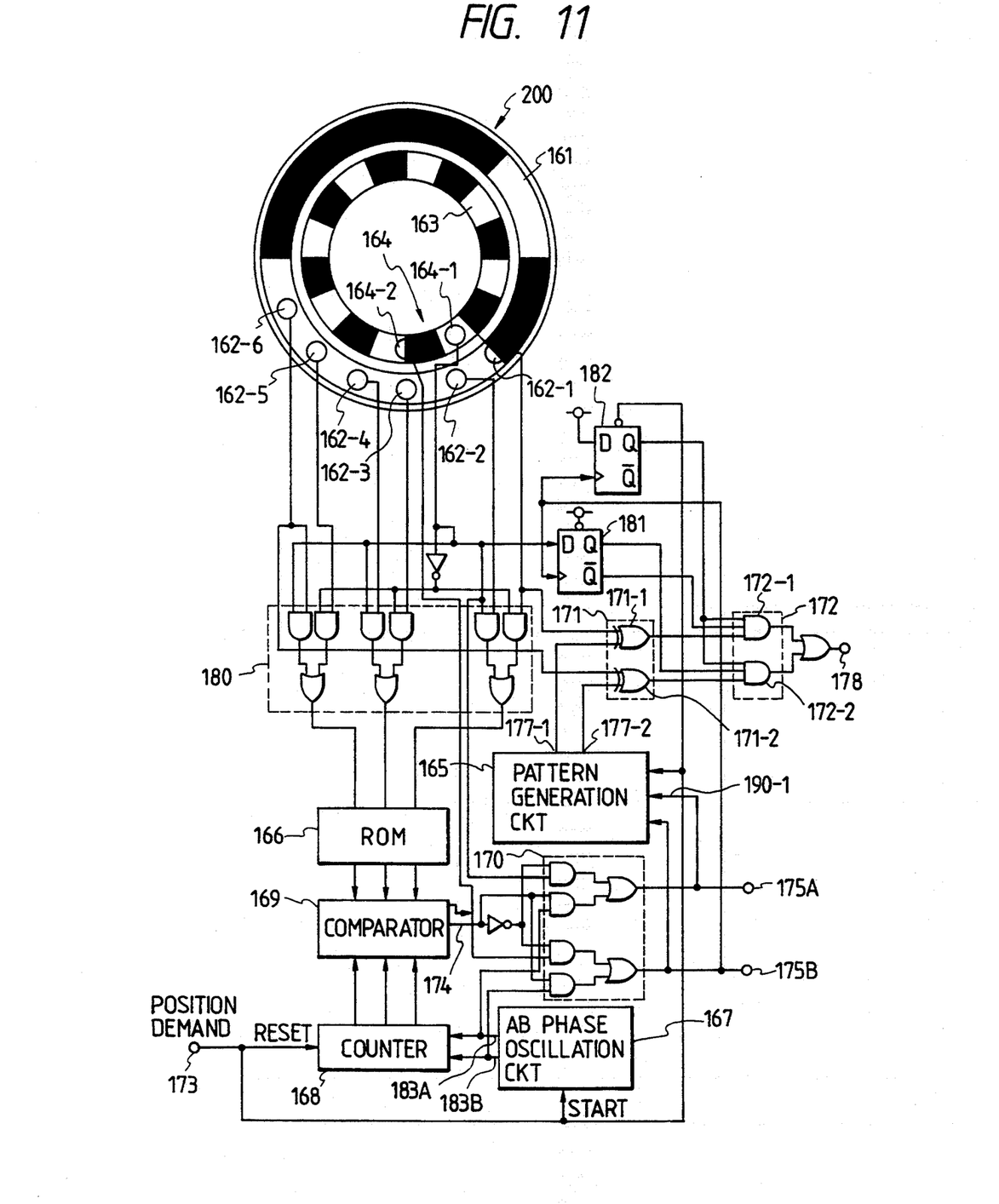
FIG. 11 is a schematic diagram showing an arrangement of the third embodiment.

An absolute encoder of the third embodiment will be described below with reference to FIGS. 11 and 12.

A code plate 200 is formed with an absolute track 161 and an incremental track 163. The codes of the tracks 161 and 163 are respectively detected by an absolute detection element group 162 and an incremental detection element group 164. Signals detected by the absolute detection element group 162 are input to a ROM 166 through a selection circuit 180, and are converted by the ROM 166 into a signal indicating absolute position data.

In the third embodiment, an absolute position detection unit is substantially the same as that in the encoder of the second embodiment except for reference numerals, and a detailed description thereof will be omitted. An abnormality detection unit will be described below.

The abnormality detection unit of the third embodiment is constituted by the absolute detection element group 162, a pattern generation circuit 165, a selection circuit 170, an abnormality discrimination circuit 171, a gate 172, and flip-flops 181 and 182. Abnormality detection is attained by comparing signals generated by the pattern generation circuit 165 and output from terminals 177-1 and 177-2 with signals detected by absolute detection elements 162-5 and 162-6 or 162-1 and 162-2.

Figure 12:
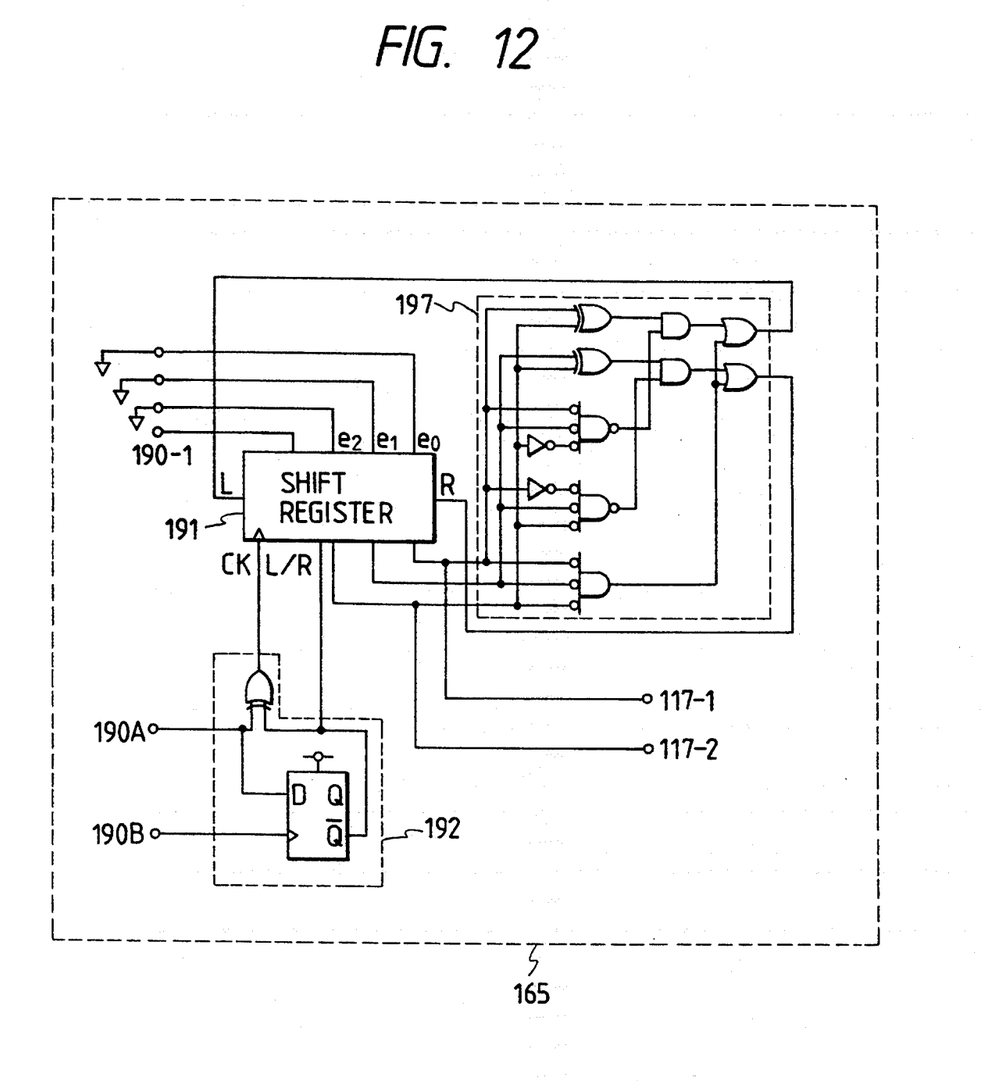
FIG. 12 is a circuit diagram showing an arrangement of a pattern generation circuit shown in FIG. 11.

As shown in FIG. 12, the pattern generation circuit 165 is constituted by a shift register 191, a direction discrimination circuit 192, and a circuit 197. When a signal is input from a terminal 190-1 when a power supply is turned on or when an absolute position demand signal is input, the shift register 191 sets signals indicating an original position (the original position may be either 0 or an arbitrary value) of the absolute track as an initial value in e0, e1, and e2. Thereafter, incremental signals indicating an absolute position from terminals 175A and 175B (see FIG. 11) are input to terminals 190A and 190B of the pattern generation circuit 165.

The direction discrimination circuit 192 sets the shift direction of the shift register 191 on the basis of the number of pulses and phase relationship of the incremental signals input to the terminals 190A and 190B. The shift register 191 shifts the signals e0, e1, and e2 in the set shift direction. The pattern generation circuit 165 outputs the signals e0 and e2, corresponding to signals detected by the absolute detection elements 162-5 and 162-6 or 162-1 and 162-2 of the shifted signals e0, e1, and e2, from the terminals 177-1 and 177-2. The circuit 197 is a circuit for forming a new signal to be set in e0 or e2 when the shift register 191 shifts the signals e0, e1, and e2 as in the circuit 107 of the second embodiment.

An EX-OR circuit as the abnormality discrimination circuit 171 (FIG. 11) discriminates whether or not the encoder is normal by comparing the signals from the terminals 177-1 and 177-2 with the signals detected by the absolute detection elements 162-5 and 162-6 or 162-1 and 162-2. As a discrimination signal, an output signal from an EX-OR gate 171-1 or 171-2 selected by the gate 172, which is enabled/disabled according to the rotating direction of the code plate 200, is output from an abnormality detection terminal 178.

In this manner, since the pattern generation circuit 165 is driven on the basis of the incremental signals externally output from the terminals 175A and 175B, and a signal from a position demand terminal 173, the absolute encoder of the third embodiment can always detect whether or not incremental signals output from the terminals 175A and 175B as well as an initial value are normal by comparing the signals detected by the absolute detection element group 162 and the signals generated by the pattern generation circuit 165 by the EX-OR circuit 171 after the power supply is turned on or after the absolute position demand signal is input.

The absolute encoder of this embodiment adopts the absolute track formed with an 8-pulse absolute pattern. However, the absolute encoder of the present invention is not limited to this. When a track formed with a P-pulse absolute pattern is used, an absolute detection element group is constituted by n or more detection elements. At this time, the relationship between the P pulses and the n detection elements are expressed by relation (i):

$$2^{n-1} < P \leq 2^n \qquad (i)$$

In this case, n is the number of elements simultaneously subjected to detection, and corresponds to three detection elements in the above embodiment. Therefore, for example, if P=1,000 pulses, n=10. At this time, a pattern generation circuit generates a code corresponding to d0 or dn according to the predetermined relationship, and an abnormality detector (EX-OR gate) discriminates whether or not an encoder is normal by comparing the code corresponding to d0 or dn with a code detected by the n detection elements.

The pattern generation circuit of this embodiment is formed by a shift register and a logic circuit, as shown in FIG. 10 or 12, but may be formed using a ROM.

The incremental detection element group of the absolute encoder of this embodiment is constituted by two detection elements. The incremental detection element group need only detect incremental signals indicating the absolute position, and the rotating direction of the code plate, and need only include at least two elements so as to be able to detect A and B phase incremental signals.

When the ratio of the minimum read unit of the absolute track to that of the incremental track is larger than that in the absolute encoder of the above embodiment, the pattern generation circuit generates a code in synchronism with the change timing of the code of the absolute track detected by the absolute detection element group. This operation can be realized by changing the output timing of a clock by a direction discrimination circuit.

In this case, whether or not an encoder is normal is detected by detecting if the code generated by the pattern generation circuit changes simultaneously with a change in code of the absolute track detected by the absolute detection element group, and by detecting whether or not the two changed codes coincide with each other.

What is claimed is:

1. An absolute encoder comprising:
   a code plate formed with an absolute pattern and an incremental pattern;
   first signal output means for detecting the absolute pattern by sequentially selecting the absolute pattern bit by bit, and outputting an absolute signal as serial data;
   second signal output means for detecting the incremental pattern, and outputting two signals having a 90°-phase difference therebetween;
   a pattern generation circuit for generating an electrical signal pattern equivalent to the absolute pattern;
   input means for inputting the absolute signal, obtained when a power supply is turned on or when a demand signal is input, to said pattern generation circuit as initial data; and
   instruction means for operating said pattern generation circuit in synchronism with the outputs from said second signal output means after the initial data is input to said pattern generation circuit.

2. An absolute encoder according to claim 1, further comprising means for, when an absolute position moves during the input operation of the initial data to said pattern generation circuit, re-inputting the initial data.

3. An absolute encoder according to claim 1, wherein a predetermined pattern of an output from said pattern generation circuit is detected, and the detected pattern is output as an original position signal.

4. An absolute encoder comprising:
   a code plate formed with a track of an absolute pattern and an incremental pattern;
   absolute detection means for detecting the absolute pattern, and outputting an absolute signal;
   incremental detection means for detecting the incremental pattern, and outputting an incremental signal;
   absolute position detection means for outputting an incremental signal corresponding to the absolute pattern read by said absolute detection means when a power supply is turned on or when a demand signal is input, and thereafter, outputting the incremental signal read by said incremental detection means as an absolute position signal;
   a pattern generation circuit for generating a code corresponding to a code detected by said absolute detection means on the basis of the incremental signal from said incremental detection means; and comparison means for comparing the code detected by said absolute detection means with the code output from said pattern generation circuit.

5. An absolute encoder according to claim 4, wherein said pattern generation circuit sets, as an initial value, the code of the absolute track detected by said absolute detection means when the power supply is turned on or when the demand signal is input, and changes the initial value on the basis of the incremental signal detected by said incremental detection means so as to generate the code corresponding to the code detected by said absolute detection means.

6. An absolute encoder according to claim 4, wherein said pattern generation circuit sets, at an initial value, an arbitrary reference point when the power supply is turned on or when the demand signal is input, and changes the initial value on the basis of the incremental signal output from said absolute position detection means to an external circuit so as to generate the code corresponding to the code detected by said absolute detection means.

7. An absolute encoder according to claim 4, further comprising abnormality detection means for detecting whether or not the incremental signal detected by said incremental detection means is normal by causing said comparison means to compare the code of the absolute track detected by said absolute detection means with the code from said pattern generation circuit.

8. An absolute encoder according to claim 4, further comprising abnormality detection means for detecting whether or not the incremental signal from said absolute position detection means is normal by causing said comparison means to compare the code of the absolute track detected by said absolute detection means with the code from said pattern generation circuit.

9. An absolute encoder comprising:
a code plate formed with an absolute pattern and an incremental pattern;
a first detector which detects the absolute pattern and outputs an absolute signal;
a second detector which detects the incremental pattern and outputs an incremental signal; and
a pattern formation circuit which forms a pattern equivalent to the absolute pattern based on the incremental signal after the absolute signal is inputted thereto.

10. An absolute encoder according to claim 9, wherein said first detector has a plurality of detection elements to detect the absolute pattern, a converter which converts parallel signals from said plurality of detection elements into a serial signal, and a processor which processes the serial signal.

11. An absolute encoder comprising:
a code plate formed with an absolute pattern and an incremental pattern;
a first detector which detects the absolute pattern and outputs an absolute signal;
a second detector which detects the incremental pattern and outputs an incremental signal;
said code plate being movable relative to said first and second detectors; and
a pattern formation circuit which forms a pattern equivalent to the absolute pattern based on the incremental signal generated upon movement of said code plate relative to said second detector after the absolute signal is inputted to said circuit according to an external inputted signal.

12. An absolute encoder comprising:
a code plate formed with an absolute pattern and an incremental pattern;
an absolute detector which detects the absolute pattern and outputs an absolute signal;
an incremental detector which detects the incremental pattern and outputs an incremental signal;
an electrical signal generator which inputs the absolute signal according to an external input signal, and generates an electrical signal corresponding to the absolute pattern based on the incremental signal input after the absolute signal is inputted; and
a comparison circuit which compares the absolute signal with the electrical signal.

13. An absolute encoder comprising:
a code plate formed with a first pattern and a second pattern;
a first detector which detects the first pattern and outputs a first signal;
a second detector which detects the second pattern and outputs a second signal; and
an information generator which generates information equivalent to the first pattern based on the second signal after the first signal is inputted thereto.

* * * * *